United States Patent
Brooks et al.

(10) Patent No.: US 8,091,477 B2
(45) Date of Patent: Jan. 10, 2012

(54) INTEGRATED DETONATORS FOR USE WITH EXPLOSIVE DEVICES

(75) Inventors: James E. Brooks, Manvel, TX (US); Nolan C. Lerche, Stafford, TX (US); Anthony F. Veneruso, Missouri City, TX (US)

(73) Assignee: Schlumberger Technology Corporation, Sugar Land, TX (US)

( * ) Notice: Subject to any disclaimer, the term of this patent is extended or adjusted under 35 U.S.C. 154(b) by 811 days.

(21) Appl. No.: 10/711,809

(22) Filed: Oct. 6, 2004

(65) Prior Publication Data
US 2005/0178282 A1    Aug. 18, 2005

Related U.S. Application Data

(63) Continuation-in-part of application No. 10/304,205, filed on Nov. 26, 2002, now Pat. No. 7,549,373.

(60) Provisional application No. 60/521,088, filed on Feb. 19, 2004, provisional application No. 60/333,586, filed on Nov. 27, 2001.

(51) Int. Cl.
*F42B 3/10* (2006.01)
*F42C 11/00* (2006.01)
*F23Q 7/00* (2006.01)

(52) U.S. Cl. .............. 102/202.7; 102/202.14; 102/206; 102/207; 102/215; 102/217; 102/218; 102/275.11; 361/248; 361/249; 361/251; 361/252

(58) Field of Classification Search ............... 102/202.5, 102/202.7, 202.14, 206, 207, 210, 215, 217, 102/218, 275.11; 361/248, 249, 251, 252
See application file for complete search history.

(56) References Cited

U.S. PATENT DOCUMENTS

| | | | | |
|---|---|---|---|---|
| 3,670,653 A | * | 6/1972 | Lunt et al. | 102/210 |
| 3,721,884 A | * | 3/1973 | Thakore | 361/251 |
| 3,913,224 A | * | 10/1975 | Preissinger et al. | 29/832 |
| 3,963,966 A | * | 6/1976 | Mohr | 361/260 |
| 4,227,461 A | * | 10/1980 | Beezley et al. | 102/218 |
| 4,304,184 A | * | 12/1981 | Jones | 102/202.13 |
| 4,421,030 A | * | 12/1983 | DeKoker | 102/218 |
| 4,538,088 A | * | 8/1985 | Malone | 313/325 |

(Continued)

FOREIGN PATENT DOCUMENTS

CN     2178346 Y    9/1994

(Continued)

OTHER PUBLICATIONS

R.L. Wahlers, C.Y.D. Huang, M.R. Heinz and A.H. Feingold; Low Profile Ltcc Transformers; Presented at the International Microelectronics and Packaging Society IMAPS, Symposium; Denver, CO; Sep. 4-6, 2002.

*Primary Examiner* — Michael David
(74) *Attorney, Agent, or Firm* — Dan Hu; Kevin McGoff

(57) ABSTRACT

A detonator assembly includes a capacitor, an initiator, a transformer and an addressable chip. The initiator is electrically connected to the capacitor, the transformer is mechanically and electrically connected to the capacitor and the addressable chip is mechanically and electrically connected to the transformer. The initiator may be bonded or fused to the capacitor, and the transformer may be bonded or fused to the capacitor. The capacitor, initiator, transformer and addressable chip form a unified integrated detonating unit.

56 Claims, 10 Drawing Sheets

U.S. PATENT DOCUMENTS

| | | | |
|---|---|---|---|
| RE32,888 E * | 3/1989 | Kirby et al. | 102/217 |
| 4,829,899 A * | 5/1989 | Wiker et al. | 102/206 |
| 4,870,902 A * | 10/1989 | Simon et al. | 102/201 |
| 5,179,248 A | 1/1993 | Hartman et al. | |
| 5,309,841 A | 5/1994 | Hartman et al. | |
| 5,341,742 A * | 8/1994 | Alford et al. | 102/202.8 |
| 5,347,929 A * | 9/1994 | Lerche et al. | 102/202.14 |
| 5,369,579 A | 11/1994 | Anderson | |
| 5,436,791 A | 7/1995 | Turano | |
| 5,444,598 A | 8/1995 | Aresco | |
| 5,725,242 A * | 3/1998 | Belau et al. | 280/735 |
| 5,731,538 A | 3/1998 | O'Brien et al. | |
| 5,908,365 A * | 6/1999 | LaJaunie et al. | 175/4.56 |
| 6,173,651 B1 | 1/2001 | Pathe | |
| 6,179,064 B1 | 1/2001 | Vaynshteyn | |
| 6,199,484 B1 | 3/2001 | Martinez-Tovar et al. | |
| 6,272,965 B1 * | 8/2001 | Baginski et al. | 86/1.1 |
| 6,302,024 B1 | 10/2001 | Swart et al. | |
| 6,318,267 B1 * | 11/2001 | Swart et al. | 102/202.5 |
| 6,356,455 B1 * | 3/2002 | Carpenter | 361/793 |
| 6,385,031 B1 | 5/2002 | Lerche et al. | |
| 6,386,108 B1 | 5/2002 | Brooks et al. | |
| 6,470,803 B1 * | 10/2002 | Liu et al. | 102/206 |
| 6,598,682 B2 * | 7/2003 | Johnson et al. | 166/370 |
| 6,903,938 B2 * | 6/2005 | Waffenschmidt | 361/779 |
| 6,911,373 B2 * | 6/2005 | Kellar et al. | 438/399 |
| 7,191,706 B2 * | 3/2007 | Chase et al. | 102/217 |
| 7,236,345 B1 * | 6/2007 | Roesler et al. | 361/247 |
| 2004/0003743 A1 | 1/2004 | Brooks et al. | |
| 2006/0144278 A1 * | 7/2006 | Gerez | 102/202.5 |

FOREIGN PATENT DOCUMENTS

| | | |
|---|---|---|
| EP | 0555651 A1 | 8/1993 |
| EP | 0561499 A1 | 9/1993 |
| GB | 2253683 A | 9/1992 |
| GB | 2352261 A | 1/2001 |
| GB | 2357825 A | 7/2001 |
| GB | 2388420 A | 11/2003 |
| WO | WO 00/20820 A2 | 4/2000 |
| WO | WO 01/46638 A1 | 6/2001 |
| WO | 02099356 A2 | 12/2002 |

* cited by examiner

| UNIT | OPERATIONAL SEQUENCE TIME → | | | | |
|---|---|---|---|---|---|
| A | FIRE | | | | |
| B | SENSE AND DISCONNECT | FIRE | | | |
| C | SLEEP | SENSE AND DISCONNECT | FIRE | | |
| D | SLEEP | SLEEP | SENSE AND DISCONNECT | FIRE | |
| E | SLEEP | SLEEP | SLEEP | SENSE AND DISCONNECT | FIRE |

SHOT BY SHOT

INTEGRATED DETONATORS FOR USE WITH EXPLOSIVE DEVICES

CROSS-REFERENCE TO RELATED APPLICATIONS

This claims the benefit under 35 U.S.C. §119(e) of U.S. Provisional Patent Application Ser. No. 60/521,088, entitled, "MICROELECTROMECHANICAL DEVICES," filed on Feb. 19, 2004. This is also a continuation-in-part of U.S. Ser. No. 10/304,205, filed Nov. 26, 2002, which claims the benefit under 35 U.S.C. §119(e) of U.S. Provisional Patent Application Ser. No. 60/333,586, entitled, "INTEGRAL CAPACITOR DISCHARGE UNIT," filed on Nov. 27, 2001.

BACKGROUND

The present invention relates generally to activating devices, and more particularly to an integrated detonator for use in activating explosives.

Explosives are used in many types of applications, such as hydrocarbon well applications, seismic applications, military armament, and mining applications. In seismic applications, explosives are discharged at the earth surface to create shock waves into the earth subsurface so that data regarding the characteristics of the subsurface may be measured by various sensors. In the hydrocarbon well context, a common type of explosive that is used includes shaped charges in perforating guns. The shaped charges, when detonated, create perforating jets to extend perforations through any surrounding casing or liner and into the surrounding formation to allow communication of fluids between the formation and the wellbore. Also, in a well, other tools may also contain explosives. For example, explosives can be used to set packers or to activate other tools.

To detonate explosives, detonators are used. Generally, detonators can be of two types: electrical and percussion. A percussion detonator responds to some type of mechanical force to activate an explosive. An electrical detonator responds to a predefined electrical signal to activate an explosive. One type of electrical detonator is referred to as an electro-explosive device (EED), which may include hot-wire detonators, semiconductor bridge (SCB) detonators, exploding bridge wire (EBW) detonators, or exploding foil initiator (EFI) detonators.

With certain types of electrical detonators, a local electrical source is placed in the proximity of the detonator. Such an electrical source may be in the form of a capacitor discharge unit that includes a capacitor that is charged to a predetermined voltage. In response to an activation signal, the charge stored in the capacitor is discharged into another device to perform a detonation operation. Typically, due to the relatively large amount of energy that is needed, the capacitor discharge unit can be quite large, which leads to increased sizes of housings in downhole tools that contain such capacitor discharge units. Further, because of relatively large sizes, the efficiencies of conventional capacitor discharge units are reduced due to increased resistance and inductance of electrical paths in a detonator.

SUMMARY

In general, an improved detonator is provided that is smaller in size and that is more efficient. For example, in one embodiment, a detonator assembly includes an energy source (e.g., a capacitor) having a surface, the energy source further having electrodes. A resistor is formed on the surface of the energy source, with one end of the resistor being electrically connected to one of the electrodes.

In some example embodiments, resistors are formed on the surface of the capacitor with thick-film deposition. For example, one type of resistor is a charging resistor. Another type of resistor is a bleed resistor that connects the two electrodes. The surface of the capacitor is used to attach electrically a switch and/or an initiator, such as an exploding foil initiator (EFI).

In other example embodiments, an improved detonator includes an EFI, switch, capacitor, bleed resistor, transformer, and addressable chip integrated to form a monolithic unit having the size of a conventional hot-wire detonator. The monolithic unit may also include a line protection filter and an explosive.

In another example embodiment, an improved detonator may be embedded in a tubing cutter or used to initiate the firing of a tubing cutter or jet cutter. Alternatively, an embodiment of the improved detonator may be used to initiate one or more shaped charges.

Other features and embodiments will become apparent from the following description, from the drawings, and from the claims.

DETAILED DESCRIPTION

In the following description, numerous details are set forth to provide an understanding of the present invention. However, it will be understood by those skilled in the art that the present invention may be practiced without these details and that numerous variations or modifications from the described embodiments may be possible.

As used herein, the terms "connect", "connection" "connected", "in connection with", and "connecting" are used to mean "in direct connection with" or "in connection with via another element"; the terms "mechanically connect", "mechanical connection", and "mechanically connected", "in mechanical connection with", and "mechanically connecting" means in direct physical connection to form a monolithic unit such as bonded, fused, or integrated; and the term "set" is used to mean "one element" or "more than one element"; the terms "up" and "down", "upper" and "lower", "upwardly" and downwardly", "upstream" and "downstream"; "above" and "below"; and other like terms indicating relative positions above or below a given point or element are used in this description to more clearly describe some embodiments of the invention. However, when applied to equipment and methods for use in wells that are deviated or horizontal, such terms may refer to a left to right, right to left, or other relationship as appropriate. As used here, the terms "up" and "down"; "upper" and "lower"; "upwardly" and downwardly"; "above" and "below"; and other like terms indicating relative positions above or below a given point or element are used in this description to more clearly describe some embodiments of the invention. However, when applied to equipment and methods for use in wells that are deviated or horizontal, or when such equipment are at a deviated or horizontal orientation, such terms may refer to a left to right, right to left, or other relationship as appropriate.

Figure 1A:
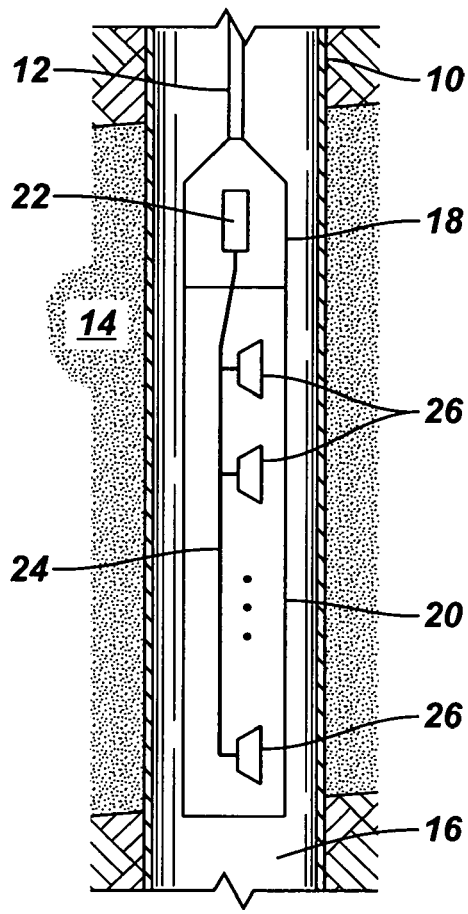
FIGS. 1A and 1B illustrate two tool strings according to some embodiments of the invention.

Referring to FIG. 1A, an embodiment of a tool string includes a perforating string having a perforating gun 20 and a firing head 18. The perforating string is attached at the end of a carrier line 12, such as a wireline, electrical cable, slickline, tubing, and so forth. In the embodiment of FIG. 1A, the firing head 18 includes an exploding foil initiator (EFI) detonator assembly 22 according to one embodiment. As discussed below, the EFI detonator assembly 22 includes an integrated assembly of a capacitor discharge unit (CDU) and EFI. It should be noted, in the embodiments using wireline or tubing to suspend the perforating string, a downhole battery may be used to supply power to the EFI.

More generally, the integrated capacitor discharge unit has a capacitor and a charging and bleed resistor. The integrated capacitor discharge unit includes a thick-film circuit that electrically connects the capacitor and the resistor, as well as other components.

The detonator assembly 22 is coupled to a detonating cord 24, which is connected to a number of shaped charges 26. Activation of the detonator assembly 22 causes initiation of the detonating cord 24, which in turn causes detonation of the shaped charges 26. Detonation of the shaped charges 26 causes the formation of perforating jets from the shaped charges 26 to extend openings into the surrounding casing 10 and to extend perforation tunnels into the surrounding formation 14.

Figure 1B:
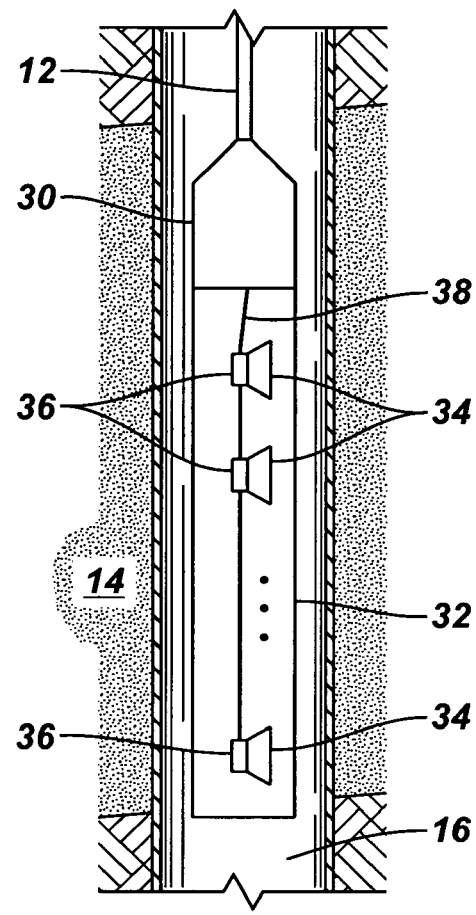

FIG. 1B shows another embodiment of the perforating string, which includes a firing head 30 and a perforating gun 32. The perforating gun 32 also includes multiple shaped charges 34. However, instead of the shaped charges 34 being connected to a detonating cord, each shaped charge 34 is associated with a respective local detonator assembly 36. In one embodiment, each of the detonator assemblies 36 includes EFI detonator assemblies that are configured similarly to the detonator assembly 22 of FIG. 1A. The detonator assemblies 36 are connected by an electrical cable 38, which provides an electrical signal to the detonator assemblies 36 to activate such detonator assemblies. The firing head 30 receives a remote command from elsewhere in the wellbore 16 or from the surface of the wellbore.

A benefit offered by the perforating string of FIG. 1B is that the shaped charges 34 can be substantially simultaneously detonated in response to an activating signal or voltage supplied down the electrical cable 38, or fired in any desired sequence or with any desired delay. This is contrasted to the arrangement of FIG. 1A, where detonation of successive shaped charges 26 is delayed by the speed of a detonation wave traveling down the detonating cord 24.

Although the arrangement of FIG. 1B includes multiple detonating assemblies 36, as compared to the single detonator assembly 22 in the arrangement of FIG. 1A, the small size of the detonating assemblies 36 according to some embodiments allows such detonating assemblies to be included in the perforating gun 32 without substantially increasing the size of the perforating gun 32.

As noted above, in one embodiment, an electrical signal is provided to the firing head 22 or 30 to activate the perforating gun 20 or 32. However, in alternative embodiments, the activating signal can be in the form of pressure pulse signals, hydraulic pressure, motion signals transmitted down the carrier line 12, and so forth.

Instead of perforating strings, detonator assemblies according to some embodiments can be used in other types of tool strings. Examples of other tool strings that contain explosives include the following: pipe cutters, setting devices, and so forth. Also, detonator assemblies according to some embodiments can also be used for other applications, such as seismic applications, mining applications, demolition, or military armament applications. In seismic applications, the detonator assemblies are ballistically connected to explosives used to generate sound waves into the earth sub-surface for determining various characteristics of the earths sub-surface.

As noted above, in one embodiment, the detonator assembly 22 includes an EFI detonator assembly. EFIs include an exploding foil "flyer plate" initiator or an exploding foil "bubble activated" initiator. Other types of detonator assemblies can use other types of electrical initiators, such as exploding bridge wire (EBW) initiators and semiconductor bridge (SCB) initiators.

Figure 2:
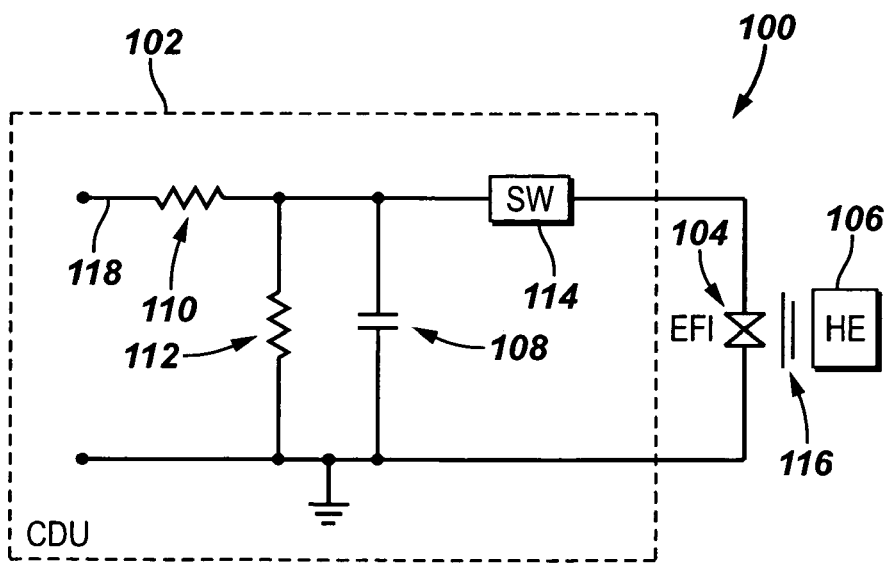
FIG. 2 is a schematic electrical diagram of a detonator assembly that can be used in the tool string according to FIG. 1A or 1B.

As shown in FIG. 2, an electrical schematic diagram of one embodiment of a detonator assembly 100. The detonator assembly 100 can be either the detonator assembly 22 of FIG. 1A or the detonator assembly 36 of FIG. 1B. The detonator assembly 100 includes a capacitor discharge unit (CDU) 102, an EFI 104, and a high explosive (HE) 106.

The CDU 102 includes a capacitor 108, a charging resistor 110, and a bleed resistor 112. In addition, the CDU 102 includes a switch 114 for coupling charge stored in the capacitor 108 to the EFI 104 to activate the EFI 104. When activated, the EFI 104 produces a flyer that is propelled at usually hyper-sonic velocity and traverses a gap 116 to impact the high explosive 106. In some embodiments, the flyer may be fabricated from a metal-foil or polymer-foil material. The impact of the flyer against the high explosive 106 causes detonation of the explosive 106. The explosive 106 is ballistically coupled to either the detonating cord 24 (FIG. 1A) or to an explosive of a shaped charge 34 (FIG. 1B). In some embodiments, the internal resistance of the capacitor may be sufficient and a separate charging resistance not necessary.

The capacitor 108 is charged by applying a suitably high DC voltage at line 118. The voltage is supplied through the charging resistor 110 into the capacitor 108. The charging resistor 110 is provided for limiting current (in case of a short in the capacitor 108 or elsewhere in the CDU 102). The charging resistor 110 also provides isolation of the CDU 102 from other CDUs in the tool string.

The bleed resistor 112 allows the charge in the capacitor 108 to bleed away slowly. This is in case the detonator assembly 100 is not fired after the tool string has been lowered into the wellbore. The bleed resistor 112 prevents the CDU 102 from becoming a safety hazard when a tool string with unfired detonator assemblies 100 have to be retrieved back to well surface.

In other embodiments, other detonator assemblies with other types of energy sources (other than the capacitor 108) can be employed.

The detonator assembly 100 includes an integrated assembly of the CDU 102 and EFI 104 to provide a smaller detonator assembly package as well as to improve efficiency in performance of the detonator assembly 100. Efficient CDUs need to have fast discharge times (such as nanosecond reaction rates through a low inductance path) through the EFI with low energy loss (low resistance). One way to increase the efficiency is to reduce as much as possible the inductance (L) and resistance (R) of the total circuit in the discharge loop of the CDU 102. By integrating the CDU 102 into a smaller package, the inductance and resistance can be reduced, thereby improving the efficiency of the CDU 102.

According to some embodiment of the invention, the charging resistor 110 and bleed resistor 112 are implemented as resistors formed on a surface of the capacitor 108. Further, in some embodiments, the switch 114 is also integrated onto the surface of the capacitor 108, which further reduces the overall size of the CDU 102.

Figure 3:
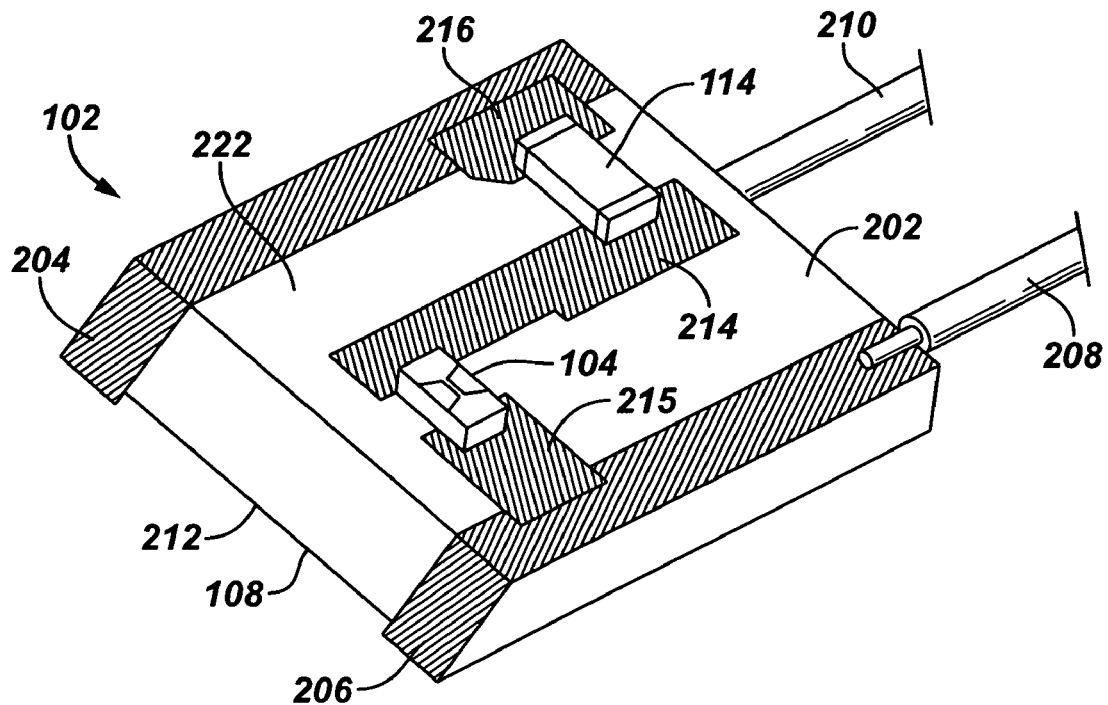
FIG. 3 is a perspective view of the detonator assembly.

FIG. 3 shows the CDU 102 according to one embodiment. The capacitor 108 in one embodiment includes a ceramic capacitor, which has an outer ceramic housing 202 formed of a ceramic material. However, in other embodiments, other types of capacitors can be used. The capacitor 108 includes a first group of one or more electrically conductive layers that are connected to one electrode, referred to as a cathode. A second group of one or more electrically conductive layers in the capacitor 108 are connected to another electrode of the capacitor, referred to as an anode. One or more layers of dielectric material are provided between the cathode and anode electrically conductive layers. The cathode layers, anode layers, and dielectric layers are provided inside the outer housing 202 of the capacitor 108. As shown in FIG. 3, the capacitor 108 has a first electrode 204 and second electrode 206. The electrodes 204 and 206 form the cathode and anode of the capacitor 108.

The capacitor electrode 206 is electrically contacted to an electrical wire 208. Another electrical wire 210 is connected to a node of the charging resistor (not shown in FIG. 3), which is formed on the lower surface 212 of the capacitor 108.

Further, the EFI 104 is attached on an upper surface 222 of the capacitor 108. One side of the EFI 104 is connected by an electrically conductive plate 215 to the electrode 206 of the capacitor 108. The other side of the EFI 104 is electrically connected to an electrically conductive plate 214, which is in turn connected to one side of the switch 114. The other side of the switch 114 is electrically connected by another electrically conductive plate 216 to the capacitor electrode 204. Electrical connections are provided by thick-film deposition, or other equivalent methods. Any number of types of small switches can be used, such as those disclosed in U.S. Pat. No. 6,385,031 and U.S. Ser. No. 09/946,249, filed Sep. 5, 2001, both hereby incorporated by reference. Also, the EFI may include an integral switch as part of its construction.

Figure 4:
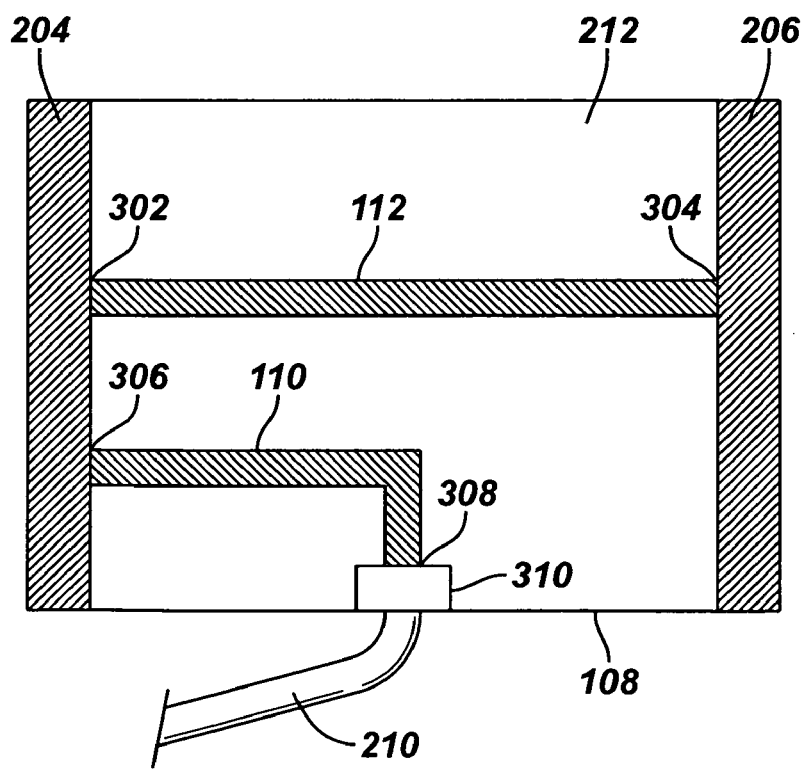
FIG. 4 is a bottom view of the detonator assembly.

A bottom view of the CDU 102 is shown in FIG. 4. The bleed resistor 112 and charging resistor 110 are both arranged as thick-film or thin-film resistors on the lower surface 212 of the capacitor 108. One end 302 of the bleed resistor 112 is electrically connected to the electrode 204, while the other end 304 of the resistor 112 is electrically connected to the electrode 206. One end 306 of the charging resistor 110 is electrically connected to the electrode 204, while the other end 308 of the resistor 110 is electrically connected to a contact pad 310. The contact pad 310 allows electrical connection of charging resistor 110 with the electrical wire 210.

The material and geometry (thickness, length, width) of each resistor 110 and 112 are selected to achieve a target sheet resistance so that desired resistance values of resistors 110 and 112 can be achieved. In other embodiments, instead of thick-film or thin-film resistors, other types of resistors that can be deposited, bonded, or otherwise formed on the capacitor housing can be used.

To form the resistors on a surface (or surfaces) of the capacitor housing, a groove or notch can be formed in the outer surface(s) of the capacitor housing, followed by the deposition or introduction of resistance material into the groove or notch. Alternatively, a resistive material may be silk-screened or printed onto the surface(s), or other techniques may be used.

Figure 5:
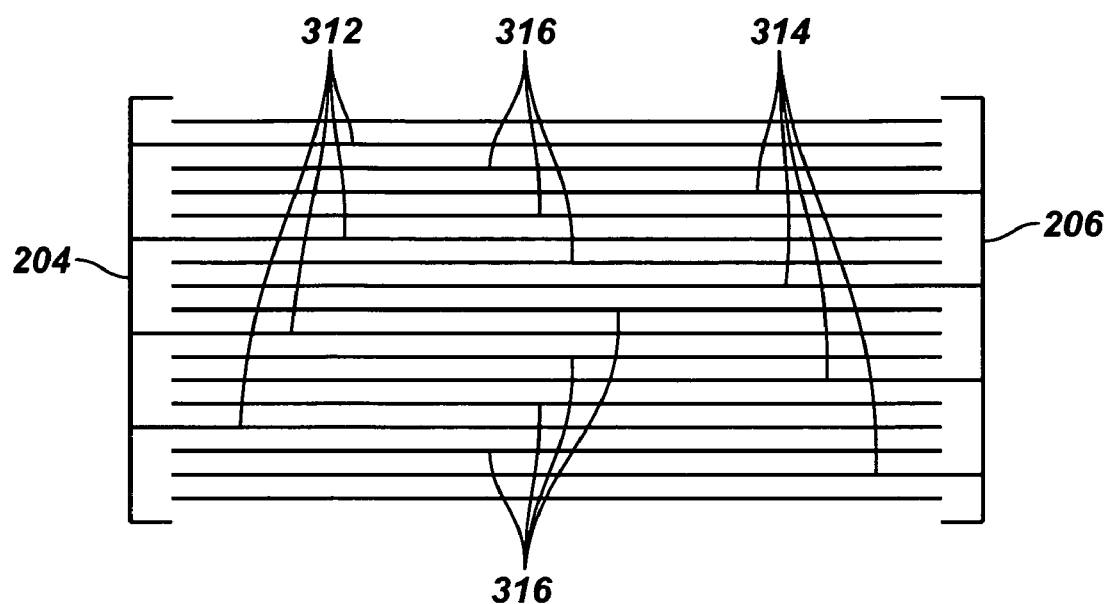
FIG. 5 is a schematic side view of a capacitor in the detonator assembly.

FIG. 5 shows a schematic representation of the layers of the capacitor 108. Electrically conductive layers 312 are connected to the first electrode 204, while electrically conductive layers 314 are connected to the electrode 206. In some embodiments, the electrically conductive layers 312 and 314 are formed of a metal, such as copper, silver-palladium alloy, or other electrically conductive metal. Dielectric layers are provided between successive layers 312 and 314.

Figure 6:
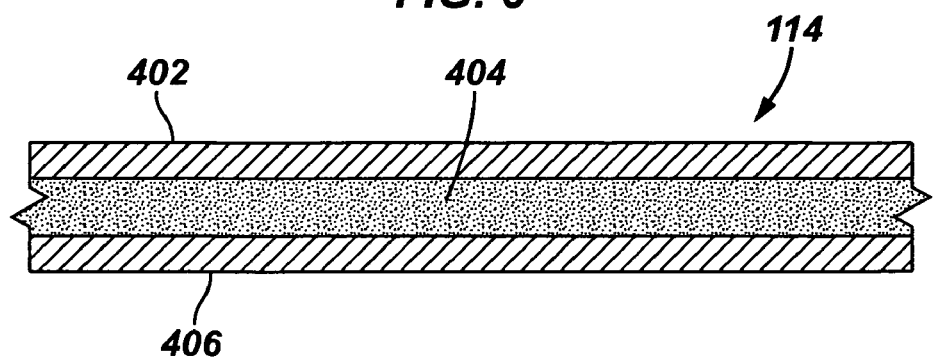
FIGS. 6 and 7 illustrate two different types of switches used in the detonator assembly of FIG. 2.

According to one embodiment, the switch 114 (FIG. 2) is implemented as an over-voltage switch. As shown in FIG. 6, one embodiment of the over-voltage switch 114 includes a first electrically conductive layer 402 and a second electrically conductive layer 406. Interposed between the electrically conductive layers 402 and 406 is an insulating (dielectric) layer 404. In one example implementation, the electrically conductive layers 402 and 406 are formed of copper or other electrically conductive metal. In one example implementation, the insulating layer 404 is formed of a polyimide material.

The insulating layer 404 has a thickness and a doping concentration controlled to cause the switch 114 to activate at a selected voltage difference between electrically conductive layers 402 and 406. Once the voltage crosses over some predefined threshold level, the insulating layer 404 breaks down to electrically connect the first and second electrically conductive layers 402 and 406 (thereby closing the switch 114).

Optionally, the breakdown voltage of the insulating layer 404 can be controlled by having the geometry of overlapping electrically conductive layers 402 and 406 be somewhat pointed to increase the potential gradient at the points. Further, depositing a hard metal such as tungsten on contact areas of the first and second electrically conductive layers 402 and 406 can prevent burn-back of the electrically conductive layers. The contact areas are provided to electrically connect the electrically conductive layers 402 and 406 to respective wires. The hardened metal also provides for a more efficient switch. Also, for increased efficiency, the gap distance between points is made small, such as on the order of a few thousands of an inch.

Figure 7:
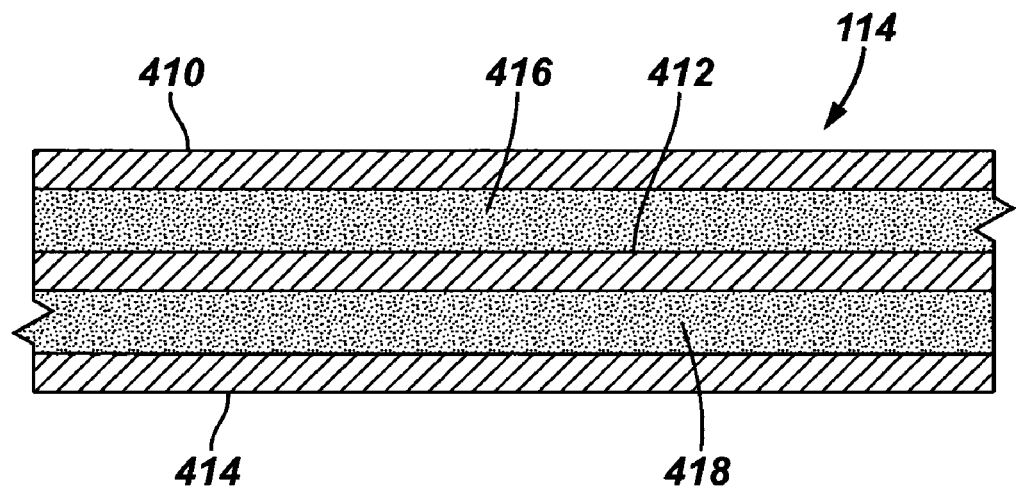

FIG. 7 illustrates another type of switch 114. This alternative switch is a triggered switch that adds another electrically conductive layer that is connected to a trigger voltage. As shown in FIG. 7, the triggered switch 114 includes top and bottom electrically conductive layers 410 and 414, in addition to an intermediate electrically conductive layer 412. Insulating layers 416 and 418 are provided between successively electrically conductive layers. In operation, a high voltage (reference to ground) with a fast rise time is applied to the trigger anode 412. The trigger voltage has sufficient amplitude to cause the insulating layers 416 and 418 to break down to allow conduction between the top and bottom electrically conductive layers 410 and 414.

In other embodiments of the detonator of the present invention, micro-switches may be integrated to form a small, low-cost detonator utilizing Exploding Foil Initiator technology. For example, in one embodiment, a micro-switchable EFI detonator is small enough to fit inside a standard detonator housing, thereby simplifying logistics and packaging, easing assembly, and improving overall reliability while replacing the less safe hot-wire detonator. A "micro-switch" may be used as disclosed in U.S. Ser. No. 10/708,182, filed Feb. 13, 2004, which is hereby incorporated by reference. Such a micro-switch may include, but is not limited to, a microelectromechanical system (MEMS) switch, a switch made with microelectronic techniques similar to those used to fabricate integrated circuit devices, a bistable microelectromechanical switch, a spark gap switch, a switch having nanotube electron emitters (e.g., carbon nanotubes), a metal oxide silicon field-effect transistor (MOSFET), an insulated gate field-effect transistor (IGFET), and other micro-switching devices.

Figure 8A:
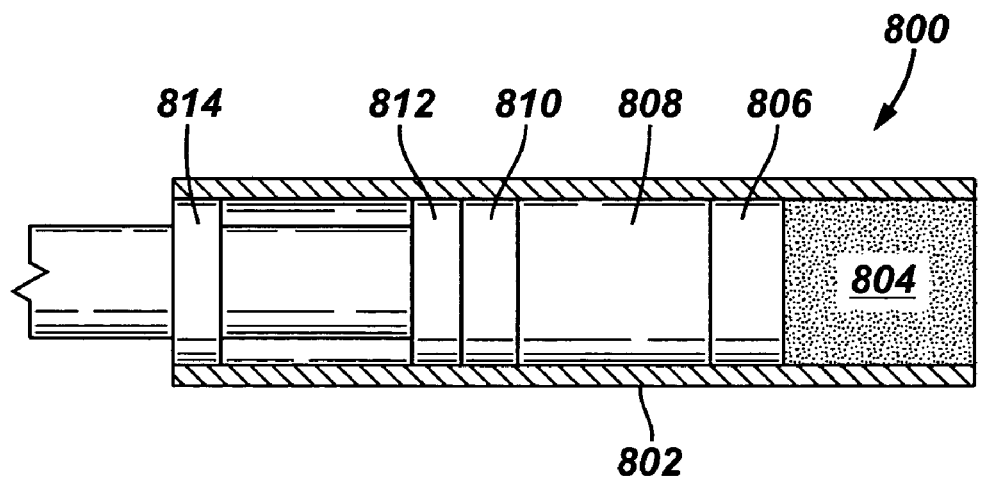
FIGS. 8A and 8B illustrates an embodiment of the microswitch of the present invention as used in an integrated detonator device.
Figures 8B, 9:
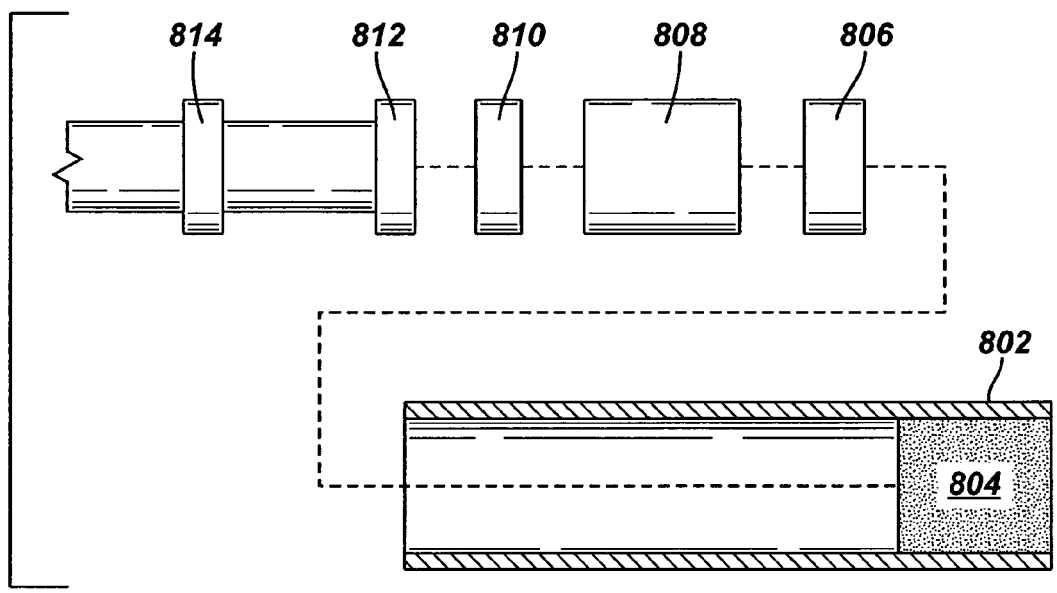
FIG. 9 illustrates an example of the addressable functionality of an embodiment of the integrated detonator device of FIGS. 8A and 8B.

With respect to FIGS. 8A and 8B, in general, an embodiment of the present invention may include a small, monolithic detonator 800 with all components integrated into a single unit. The components may include, but are not limited to: an integrated capacitor discharge unit 808 including a charging resistor and bleeder resistor that are fused or bonded together with a micro-switch and an initiator (e.g., an EFI, EBW, SCB, hot-wire, or other initiator), an initiating explosive 806, a conventional explosive 804 (e.g., PETN, RDX, HMX, CL-20, HNS, NONA and/or other explosive), a step-up transformer 810 for receiving a low voltage input and stepping up to a high voltage output, and an addressable chip 812. In another embodiment, a microchip may be employed for ease of design. The resultant size of the integrated detonator 800 is small enough to be packaged inside a standard detonator housing 802 and may receive power via a standard plug 814.

An embodiment of the detonator 800 has a size and shape substantially equal to that of a standard cylindrical hot-wire detonator. For example, some standard hot-wire detonators have a cross-sectional diameter of approximately 0.28 inches. In another example, an embodiment of the detonator 800 may have the same diameter as the detonating cord 24 (FIG. 1A) to which the detonator is coupled. This relatively small-sized detonator may be desirable over large-sized prior art detonators, which generally consist of a bulky capacitor discharge unit (CDU) (including an EFI, gas-tube switch, bleeder resistor, and capacitor), together with a multiplier, smart electronics, and explosive packaged in a relatively large housing having a 0.75 inch diameter cross section. The relatively large size of these prior art detonators limits their application and field use, as well as increases the cost of manufacturing. While this embodiment of the detonator of the present invention has a cross-sectional diameter of approximately 0.28 inches, it is intended that other embodiments may include integrated detonators having other cross-sectional diameters.

Besides having a smaller overall size, embodiments of the detonator 800 of the present invention may include various advantages over prior art detonators for facilitating safe arming and firing. Some embodiments have an added advantage of firing at lower voltage. For example, the detonator may be configured to respond to a firing voltage of as low as approximately 30 volts. Moreover, some embodiments of the detonator 800 include a radio frequency identification (RFID) tag to facilitate secure arming and triggering functions, as well as providing for identification and inventory control. Additionally, embodiments of the detonator may be rated for operation in temperatures up to approximately 340° F. Higher temperatures (up to approximately 500° F.) may be achieved with the inclusion of a thermal-delay vessel. Still other embodiments of the detonator may be fluid desensitized, radio frequency safe, and/or protected from unintended surface power.

With respect to FIGS. 8A and 8B, an embodiment of the detonator assembly 800 may include a capacitor 808 (cylindrical or rectangular) formed from a dielectric/polarized material having a built-in (e.g., thick film) bleed resistor on one end and having a EFI and micro-switch mounted on the other end. The EFI may be fused or bonded to the capacitor 808 and a micro-switch for activating the EFI may be located on the same substrate as the EFI or, alternatively, on a separate substrate. The micro-switch may be an over-voltage type in a miniaturized chamber, and, in some embodiments, the micro-switch may be enhanced by carbon nanotubes as described in U.S. Ser. No. 10/708,182.

Figure 10:
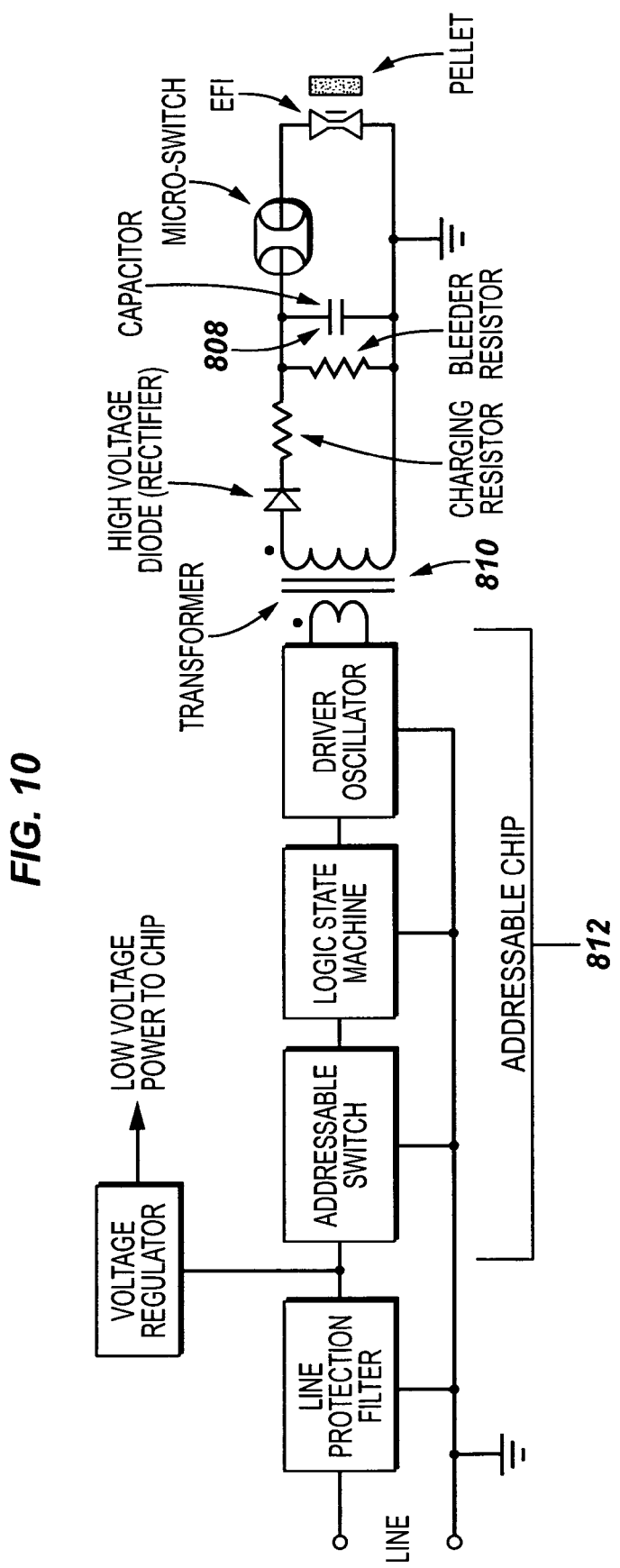
FIG. 10 illustrates an example of an embodiment of the voltage step-up transformer of the integrated detonator device.

Still with respect to FIGS. 8A and 8B, an embodiment of the detonator assembly 800 may also include a step-up transformer 810 as illustrated in the circuit diagram of FIG. 10. The transformer may be fabricated such that it is fused or bonded directly to the capacitor 800. The transformer may be capable of receiving a low-voltage input (e.g., 5 to 30 volts) and stepping up to a high voltage output (e.g., 1400 volts) via a separate high-voltage diode. In some embodiments, the transformer may be fabricated from a metallic, ceramic, or ceramic-ferrite material having high magnetic permeability characteristics using a conventional wire wind process or low temperature co-fired ceramic (LTCC) process using silk-screened conductor coils.

Further with respect to FIGS. 8A, 8B, and 10, an embodiment of the detonator assembly 800 may also include an addressable chip 812. The addressable chip 812 may facilitate control selectivity and provide added safety against accidental firing. The inclusion of an addressable chip 812 is made possible due to the low-voltage input of the transformer 810, which facilitates packaging addressability into the chip 812. The addressable chip 812 may be designed for standard CMOS integration with 5-volt or 3.3-volt operation using logic state machine. Moreover, some embodiments of the chip may be configured to have built-in digital signal processing for improved down-link signal recognition and an up-link using a bi-phased current loop.

In operation, an embodiment of the chip 812 facilitates the integration of electronic addressable functions such as: (1) uniquely identifies and selects one or more explosive initiators from a set of initiators; (2) enables the selective charging and firing of the one or more initiators and allows programming of a specific time delay; (3) enables sleep mode, or inactive state, timing delay mode, arm and fire modes and switching modes to open or close reselected circuit; (4) enables sensor mode to monitor signal from sensors (e.g., pressure, temperature, tilt angle, current, voltage, etc.); and/or (5) enables disconnect mode to disconnect bottom-fired initiators from the rest of the string by sensing a sufficient rise in current, with following progression. An illustration of the above-identified functionality is shown in FIGS. 9 and 10. It is intended that the addressable chip may be configured to perform one or all of these functions and others.

For example, an embodiment of the detonator having an addressable chip may provide a method to trigger the detonator based on an internal timer or external trigger mechanism. Furthermore, the addressable chip may include common commands to start multiple timers in a detonation string. Each timer could be preset to provide precise delays among the string. This precise control of time delays among the string enables the production of beneficial dynamic pressure-time characteristics. For example, U.S. Pat. No. 6,598,682—regarding dynamic pressure underbalance and overbalance control—discloses a system to optimize the performance of the perforation process as well as to limit the collateral damage of the gun system and other wellbore equipment by limiting the peak over-pressure and destructive pressure wave resonances and pressure wave reinforcements.

Figure 11:
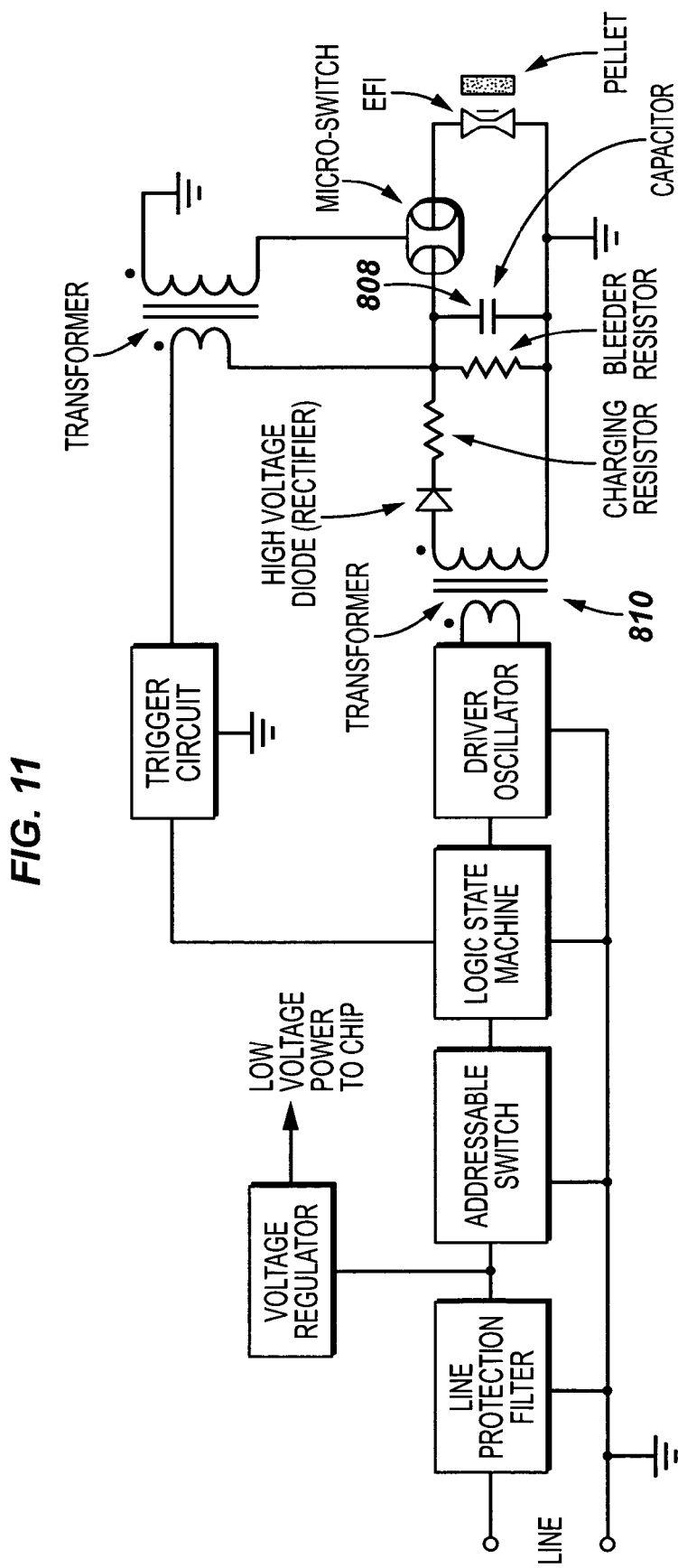
FIG. 11 illustrates an embodiment of the triggered spark gap circuitry of the integrated detonator device.

With respect to FIG. 11, another embodiment of the present invention provides a method to generate a trigger pulse by stepping up the slapper capacitor voltage using a second transformer of a type including, but not limited to, low temperature co-fired ceramic, LTCC, tape wound, air core, and/or super-cooled amorphous core. This trigger pulse enables controlled and accurate timing of the detonator's firing and more efficient charging of the slapper capacitor because it can be fully charged before it is triggered to fire the detonator. Whereas the spark gap fires whenever its threshold voltage is exceeded, the trigger circuit and trigger electrode provides alternatives for the controlled firing of the spark gap—for example, upon command from the surface, upon completion of a pre-programmed time delay, or, if a pressure sensor measurement is also employed, upon attainment of a pre-set threshold of pressure or pressure profile with time.

Figure 12:
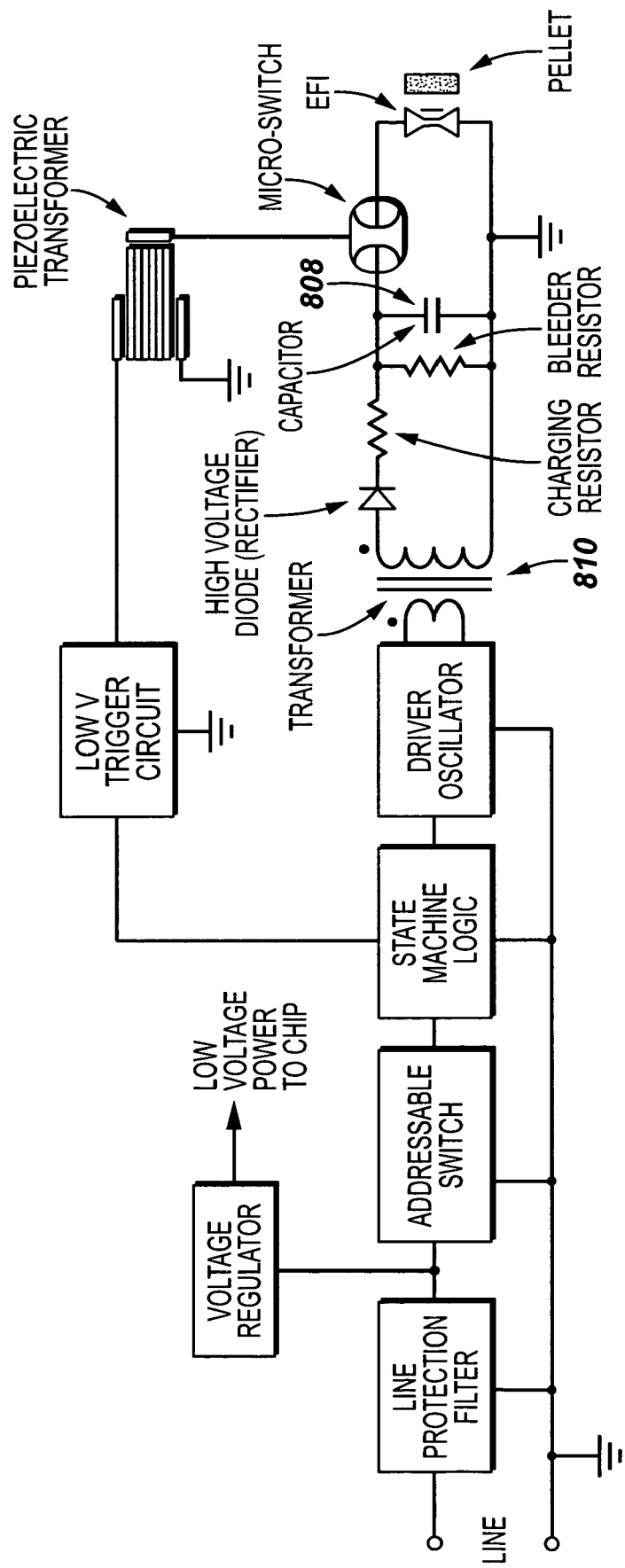
FIG. 12 illustrates an embodiment of the piezoelectric transformer of the integrated detonator device.

Another embodiment of the present invention provides a method to generate a trigger pulse by supplying voltage generated using a piezoelectric mechanical transformation, as shown schematically in FIG. 12. Compared to conventional transformers, this is an alternative triggering method achieves the benefits described above for more accurate and efficient detonator firing. This piezoelectric method also offers advantages of lower components parts count, smaller package size, and lower voltage drive by the integrated circuit.

Figure 13A:
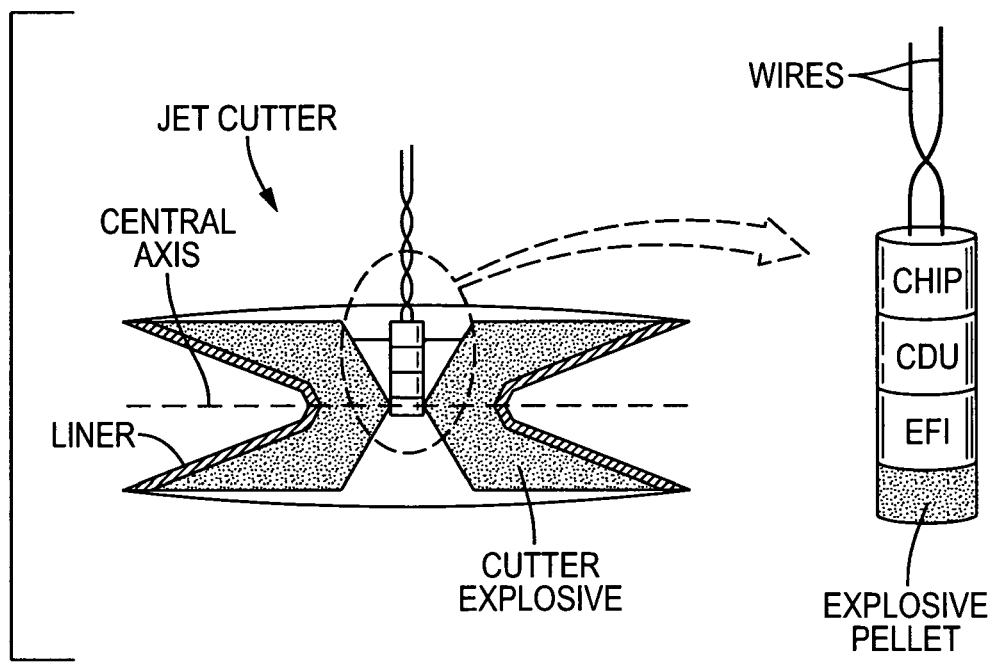
FIG. 13A-B illustrate an embodiment of the jet cutter of the integrated detonator device.
Figure 13B:
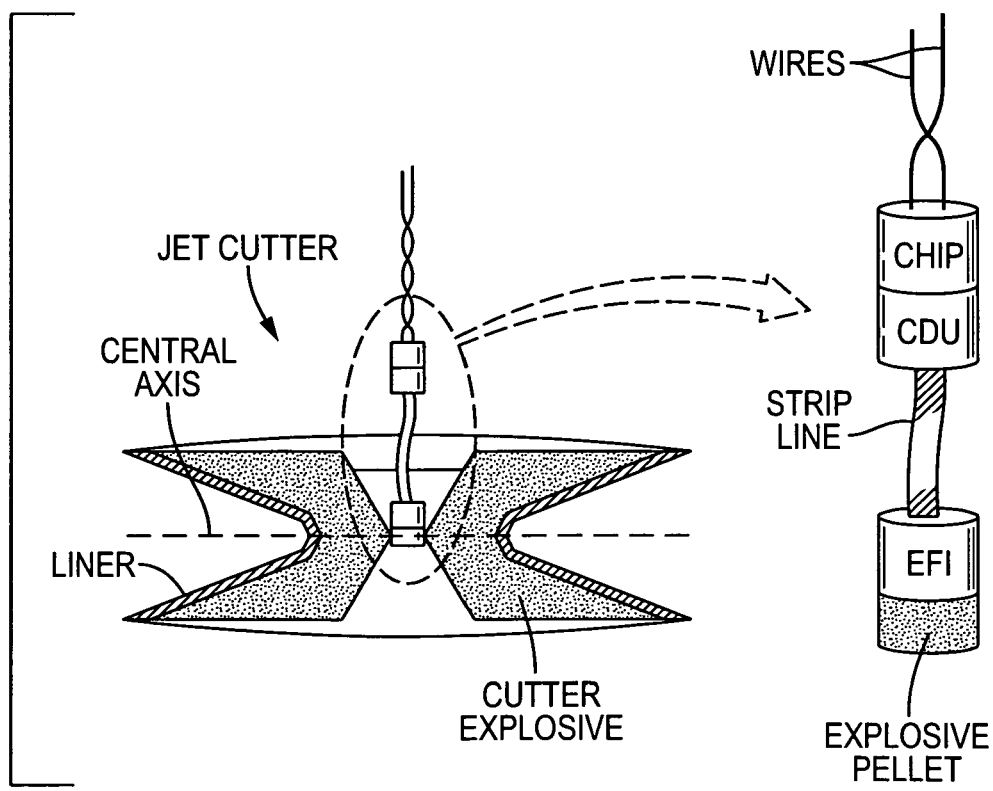

The small size of the present invention enables the novel and advantageous ability to initiate the firing of a jet cutter from its geometric center. As illustrated in FIGS. 13A and 13B, the jet cutter includes an explosive material formed intimately against a metallic liner. The liner is configured substantially about a central axis substantially to the shape of a conical frustum between a normally truncated apex and a normally truncated base. The EFI (or other initiator) with its associated CDU is positioned such that its explosive pellet is located at the center of the cutter. The EFI/CDU is attached by a pair of simple wires through the explosive center. Alternately, as shown in FIG. 13B, the EFI may be attached by a low inductance, high voltage cable to an external CDU, which is initiated by an electrical signal. In any case, the benefits of the present invention include achievement of a centered jet cutter initiation, which translates to optimum cutter performance, no external electronics or detonating cord, only simple wires from the center of the cutter, and the improved safety of this RF safe and addressable detonator.

Figure 14A:
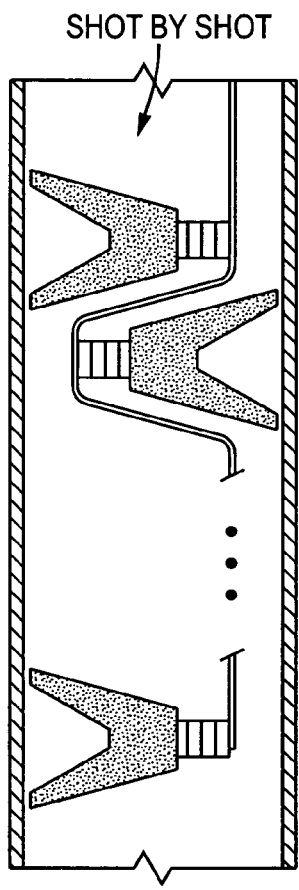
FIGS. 14A-C illustrate an embodiment of the present invention for use in detonating a shaped charge or a set of shaped charges in a shot-by-shot operation to achieve selective firing.
Figure 14B:
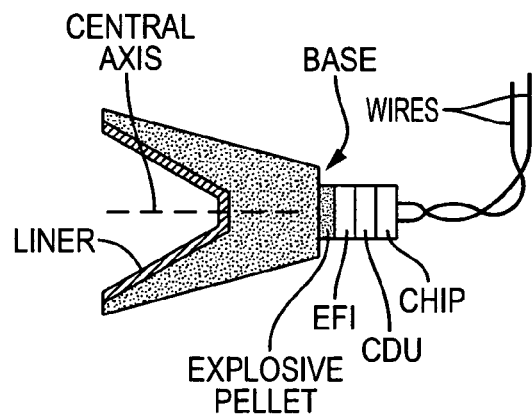
Figure 14C:
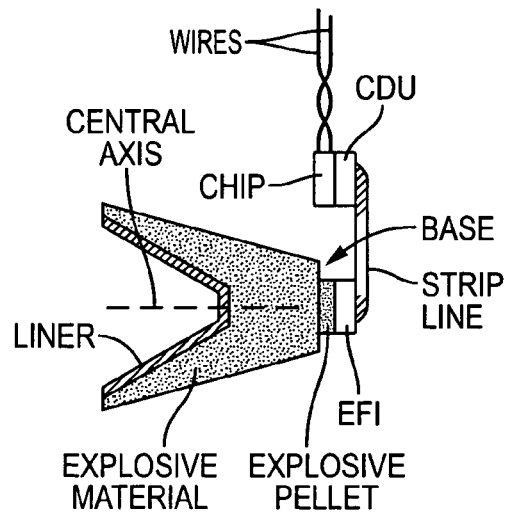

Moreover, with respect to FIGS. 14A-C, instead of being embedded in a jet cutter, embodiments of the EFI/CDU unit may be substantially embedded in or connected directly to a shaped charge having an explosive material having a truncated base and formed intimately against a liner. As with the jet cutter, the EFI/CDU may be attached by a pair of simple wires (FIG. 14B), or, alternatively, the EFI may be attached by a low inductance, high voltage cable to an external CDU, which is initiated by an electrical signal (FIG. 14C). Either of these arrangements may be used in detonating a series of shaped charges in a shot-by-shot operation to achieve selective firing (FIG. 14A).

While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. A detonator assembly, comprising:
a capacitor;
an initiator mechanically and electrically connected to the capacitor;
a transformer mechanically and electrically connected to the capacitor; and
an addressable digital chip mechanically and electrically connected to the transformer, wherein the capacitor, initiator, transformer, and addressable chip form a unified integrated detonating unit configured to respond to a command communicated from a remote source to activate an explosive;
wherein the detonator assembly is connected with a perforating string and a carrier line, the carrier line being at least one selected from a list comprising: wireline, electrical cable, slickline, and tubing; and
the carrier line connecting with the detonator assembly and perforating string downhole and extending uphole, wherein the remote source of the command is uphole and the command is transmitted along the carrier line to the detonator assembly.

2. The detonator assembly of claim 1, further comprising a capacitor discharge unit, the capacitor discharge unit comprising the capacitor and a resistor.

3. The detonator assembly of claim 2, wherein the capacitor discharge unit further comprises a thick-film circuit that electrically connects the capacitor and the resistor.

4. The detonator assembly of claim 3, wherein the resistor comprises a bleeder resistor formed by thick-film deposition, the bleeder resistor adapted to bleed charge from the capacitor.

5. The detonator assembly of claim 4, wherein the resistor comprises a charging resistor formed by thick-film deposition, the charging resistor adapted to receive a charging voltage for the capacitor.

6. The detonator assembly of claim 2, wherein the capacitor discharge unit further comprises an integrated micro-switch, the micro-switch adapted electrically to couple the charge from the capacitor to the initiator when activated.

7. The detonator assembly of claim 6, wherein the micro-switch comprises one of a microelectromechanical system switch, a bistable microelectromechanical switch, a spark gap switch, a switch having nanotube electron emitters, a MOSFET, and an IGFET.

8. The detonator assembly of claim 2, wherein the initiator comprises an exploding foil initiator fused directly to the capacitor discharge unit.

9. The detonator assembly of claim 2, wherein the capacitor is fabricated from a dielectric ceramic material.

10. The detonator assembly of claim 2, wherein the resistor is selected from the group consisting of a thick-film resistor and a thin-film resistor.

11. The detonator assembly of claim 1, wherein the initiator comprises one of a semiconductor bridge, exploding bridge wire, and exploding foil initiator.

12. The detonator assembly of claim 1, further comprising an explosive proximate the initiator.

13. The detonator assembly of claim 1, wherein the transformer is a piezoelectric transformer.

14. The detonator assembly of claim 1, further comprising a second transformer adapted to generate a trigger pulse to fire the initiator.

15. The detonator assembly of claim 1, wherein the addressable chip is adapted to identify one or more initiators from a set of initiators.

16. The detonator assembly of claim 15, wherein the addressable chip is adapted to selectively charge one or more initiators from the set of initiators.

17. The detonator assembly of claim 15, wherein the addressable chip is adapted to selectively delay for a predetermined time the charging of one or more initiators from the set of initiators.

18. The detonator assembly of claim 15, wherein the addressable chip is adapted to selectively fire one or more initiators from the set of initiators.

19. The detonator assembly of claim 15, wherein the addressable chip is adapted to selectively delay for a predetermined time the firing of one or more initiators from the set of initiators.

20. The detonator assembly of claim 1, wherein the addressable chip is adapted to inactivate the initiator.

21. The detonator assembly of claim 1, wherein the addressable chip is adapted to activate a sensor.

22. The detonator assembly of claim 21, wherein the sensor is a pressure sensor.

23. The detonator assembly of claim 1, wherein the addressable chip is adapted to disconnect a bottom-fired initiator from a string of initiators.

24. The detonator assembly of claim 1, further comprising a housing adapted to house the unified integrated detonating unit.

25. The detonator assembly of claim 24, wherein the housing has an outer diameter of approximately 0.28 inches.

26. The detonator assembly of claim 24, wherein the housing is adapted to couple with a detonating cord having a predetermined diameter.

27. The detonator assembly of claim 1, wherein the command is communicated to the unified integrated detonating unit via a stimulus comprising an electrical signal, a motion signal, a hydraulic pressure or pressure pulses.

28. The detonator assembly of claim 1, wherein the remote source is disposed in a well.

29. The detonator assembly of claim 1, wherein the remote source is disposed at the surface of a well.

30. The detonator assembly of claim 1, wherein the unified integrated detonating unit is adapted to be disposed in its entirety downhole in the well.

31. A detonator assembly, comprising:
a capacitor;
an initiator mechanically and electrically connected to the capacitor;
a transformer electrically connected to the capacitor, the transformer being bonded or fused to the capacitor; and
an addressable digital chip mechanically and electrically connected to the transformer, wherein the capacitor, initiator, transformer, and addressable chip form a unified integrated detonating unit configured to respond to a command communicated from a remote source to activate an explosive;
wherein the detonator assembly is connected with a perforating string and a carrier line, the carrier line being at least one selected from a list comprising: wireline, electrical cable, slickline, and tubing; and
the carrier line connecting with the detonator assembly and perforating string downhole and extending uphole, wherein the remote source of the command is uphole and the command is transmitted along the carrier line to the detonator assembly.

32. The detonator assembly of claim 31, further comprising a capacitor discharge unit, the capacitor discharge unit comprising the capacitor and a resistor.

33. The detonator assembly of claim 32, wherein the capacitor discharge unit further comprises a thick-film circuit that electrically connects the capacitor and the resistor.

34. The detonator assembly of claim 33, wherein the resistor comprises a bleeder resistor formed by thick-film deposition, the bleeder resistor adapted to bleed charge from the capacitor.

35. The detonator assembly of claim 34, wherein the resistor comprises a charging resistor formed by thick-film deposition, the charging resistor adapted to receive a charging voltage for the capacitor.

36. The detonator assembly of claim 32, wherein the capacitor discharge unit further comprises an integrated micro-switch, the micro-switch adapted electrically to couple the charge from the capacitor to the initiator when activated.

37. The detonator assembly of claim 36, wherein the micro-switch comprises one of a microelectromechanical system switch, a bistable microelectromechanical switch, a spark gap switch, a switch having nanotube electron emitters, a MOSFET, and an IGFET.

38. The detonator assembly of claim 32, wherein the initiator comprises an exploding foil initiator fused directly to the capacitor discharge unit.

39. The detonator assembly of claim 32, wherein the capacitor is fabricated from a dielectric ceramic material.

40. The detonator assembly of claim 32, wherein the resistor is selected from the group consisting of a thick-film resistor and a thin-film resistor.

41. The detonator assembly of claim 31, wherein the initiator comprises one of a semiconductor bridge, exploding bridge wire, and exploding foil initiator.

42. The detonator assembly of claim 31, further comprising an explosive proximate the initiator.

43. The detonator assembly of claim 31, wherein the transformer is a piezoelectric transformer.

44. The detonator assembly of claim 31, further comprising a second transformer adapted to generate a trigger pulse to fire the initiator.

45. The detonator assembly of claim 31, wherein the addressable chip is adapted to identify one or more initiators from a set of initiators.

46. The detonator assembly of claim 45, wherein the addressable chip is adapted to selectively charge one or more initiators from the set of initiators.

47. The detonator assembly of claim 46, wherein the addressable chip is adapted to selectively delay for a predetermined time the charging of one or more initiators from the set of initiators.

48. The detonator assembly of claim 46, wherein the addressable chip is adapted to selectively fire one or more initiators from the set of initiators.

49. The detonator assembly of claim 46, wherein the addressable chip is adapted to selectively delay for a predetermined time the firing of one or more initiators from the set of initiators.

50. The detonator assembly of claim 31, wherein the addressable chip is adapted to inactivate the initiator.

51. The detonator assembly of claim 31, wherein the addressable chip is adapted to activate a sensor.

52. The detonator assembly of claim 51, wherein the sensor is a pressure sensor.

53. The detonator assembly of claim 31, wherein the command is communicated to the unified integrated detonating unit via a stimulus comprising an electrical signal, a motion signal, a hydraulic pressure or pressure pulses.

54. The detonator assembly of claim 31, wherein the remote source is disposed in a well.

55. The detonator assembly of claim 31, wherein the remote source is disposed at the surface of a well.

56. The detonator assembly of claim 31, wherein the unified integrated detonating unit is adapted to be disposed in its entirety downhole in the well.

* * * * *